United States Patent [19] [11] 4,354,153
Lentz [45] Oct. 12, 1982

[54] MICROWAVE OVEN LEAKAGE DETECTOR AND METHOD OF USING SAME TO TEST DOOR SEAL LEAKAGE

[75] Inventor: Ronald R. Lentz, Wayzata, Minn.

[73] Assignee: Litton Systems, Inc., Beverly Hills, Calif.

[21] Appl. No.: 95,690

[22] Filed: Nov. 19, 1979

[51] Int. Cl.³ .......................... G01R 21/04; H05B 9/06
[52] U.S. Cl. ............................. 324/95; 219/10.55 D; 219/10.55 M; 343/703; 343/853
[58] Field of Search .......................... 324/95, 106, 72; 343/703, 771, 853; 219/10.55 R, 10.55 D, 10.55 M; 455/67; 340/600

[56] References Cited

U.S. PATENT DOCUMENTS

| 2,509,045 | 5/1950 | Salisbury . | |
| 3,746,824 | 7/1973 | Prucha | 219/10.55 |
| 3,760,271 | 9/1973 | Bach, Jr. et al. | 324/95 |
| 3,794,914 | 2/1974 | Aslan | 324/95 |
| 3,828,251 | 8/1974 | Webb | 343/703 |
| 3,879,743 | 4/1975 | Barton | 343/106 D |
| 3,989,994 | 11/1976 | Brown | 343/771 |
| 4,072,899 | 2/1978 | Shimp | 324/67 |
| 4,074,274 | 2/1978 | Fujita et al. | 346/34 |

OTHER PUBLICATIONS

"HI2610 Scanning System"; Holaday Industries, Inc., Hopkins, Minn.; 2-7-77; 6 pages.
Harrington, R. F.; "Time Harmonic Electromagnetic Fields"; McGraw-Hill, New York, N.Y.; 1961; pp. 110-111.
Butler et al.; "Electromagnetic . . . "; IEEE Trans. on Antennae and Propagation; vol. AP-26; No. 1; Jan. 1978; pp. 82-93.

Primary Examiner—Ernest F. Karlsen
Attorney, Agent, or Firm—Robert E. Lowe; John M. Haurykiewicz

[57] ABSTRACT

A stationary microwave leakage detector and method for testing microwave ovens for the maximum power density of microwaves leaking through the oven's door seals. The leakage detector is composed of an array of antennae arranged in a line generally circumscribing the circumference of the door at a fixed distance therefrom. The antennae are spaced apart a predetermined maximum distance thus insuring that a given antennae will sense at least a portion of the narrowest possible beam of microwaves emitting from the periphery of the door. Furthermore, the spacing and arrangement of the array vis-a-vis the oven door insure that the minimum power density observed by an antenna is a known ratio of the maximum power density of a narrowest beam possibly incident thereon, thus providing a means to guarantee from the measured power density levels that there are no microwaves leaking from the oven under test greater than a certain maximum power density. Alternately, the antennae are spaced such that the sum of any two adjacent antennae will be equal to or greater than the maximum power density of a narrowest beam possibly incident upon one of them. This antenna spacing provides a stationary method for testing microwave ovens for the maximum power density of microwaves leaking through the oven's door seals.

25 Claims, 12 Drawing Figures

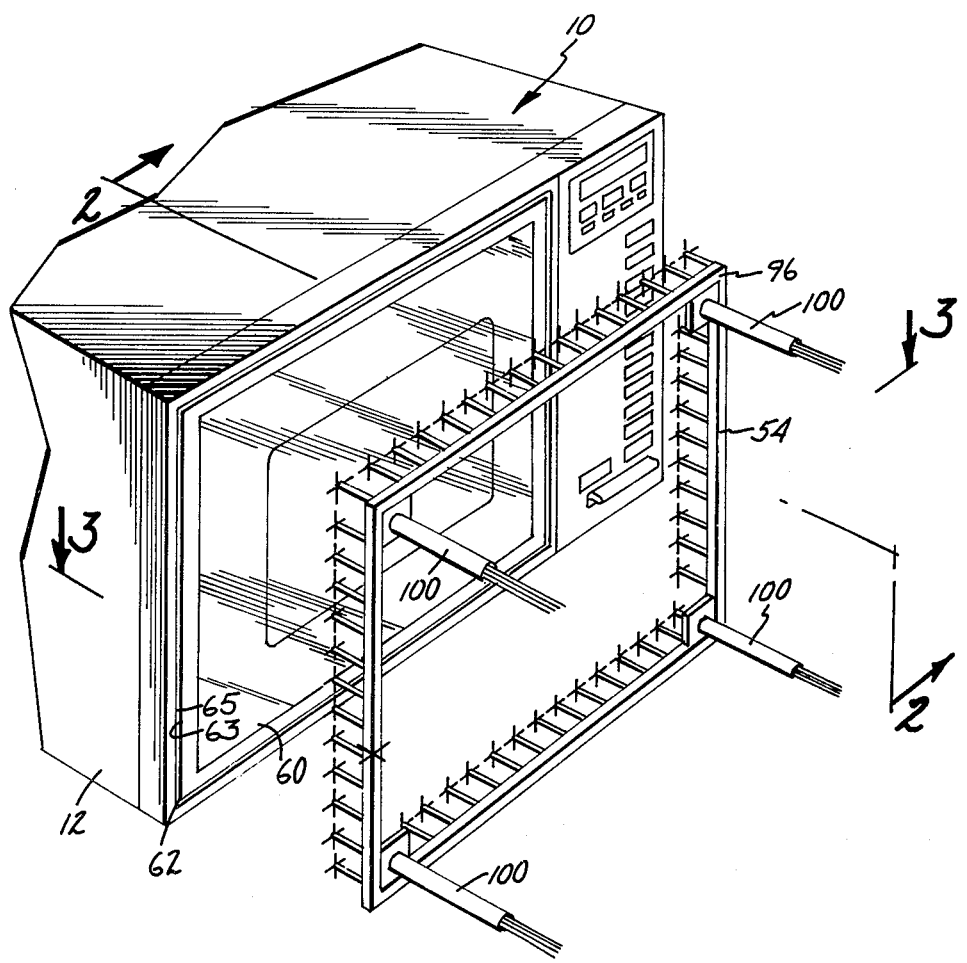
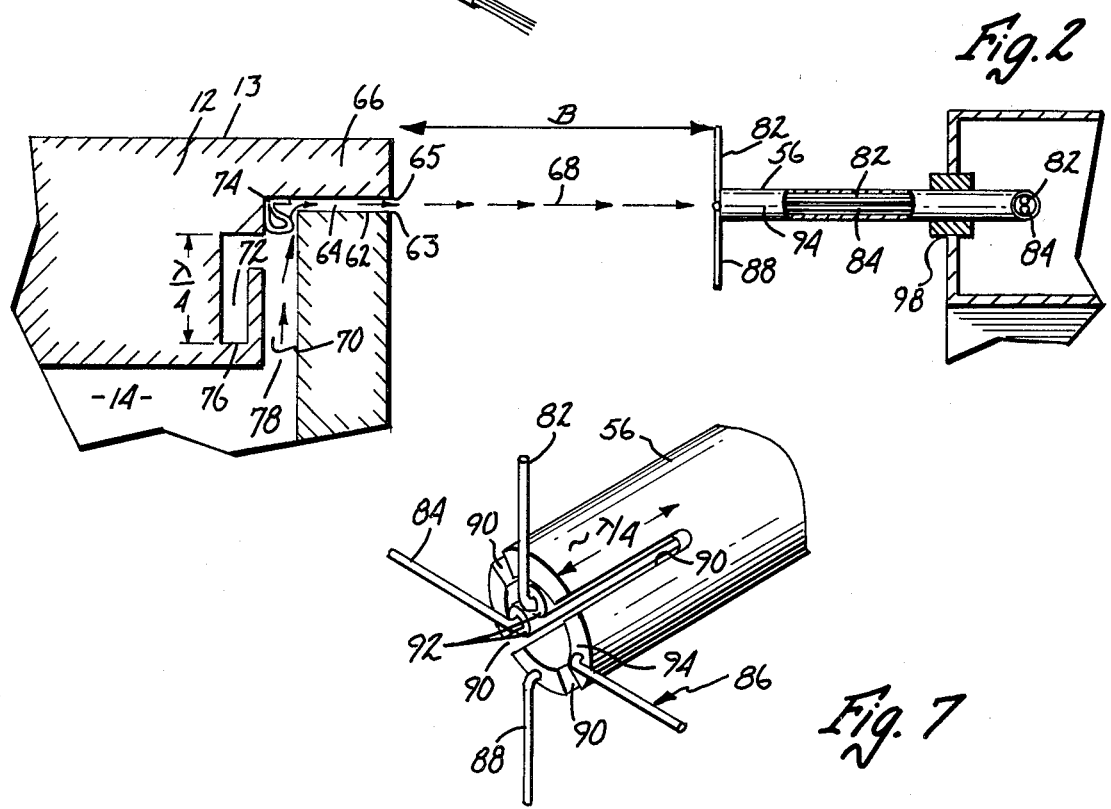

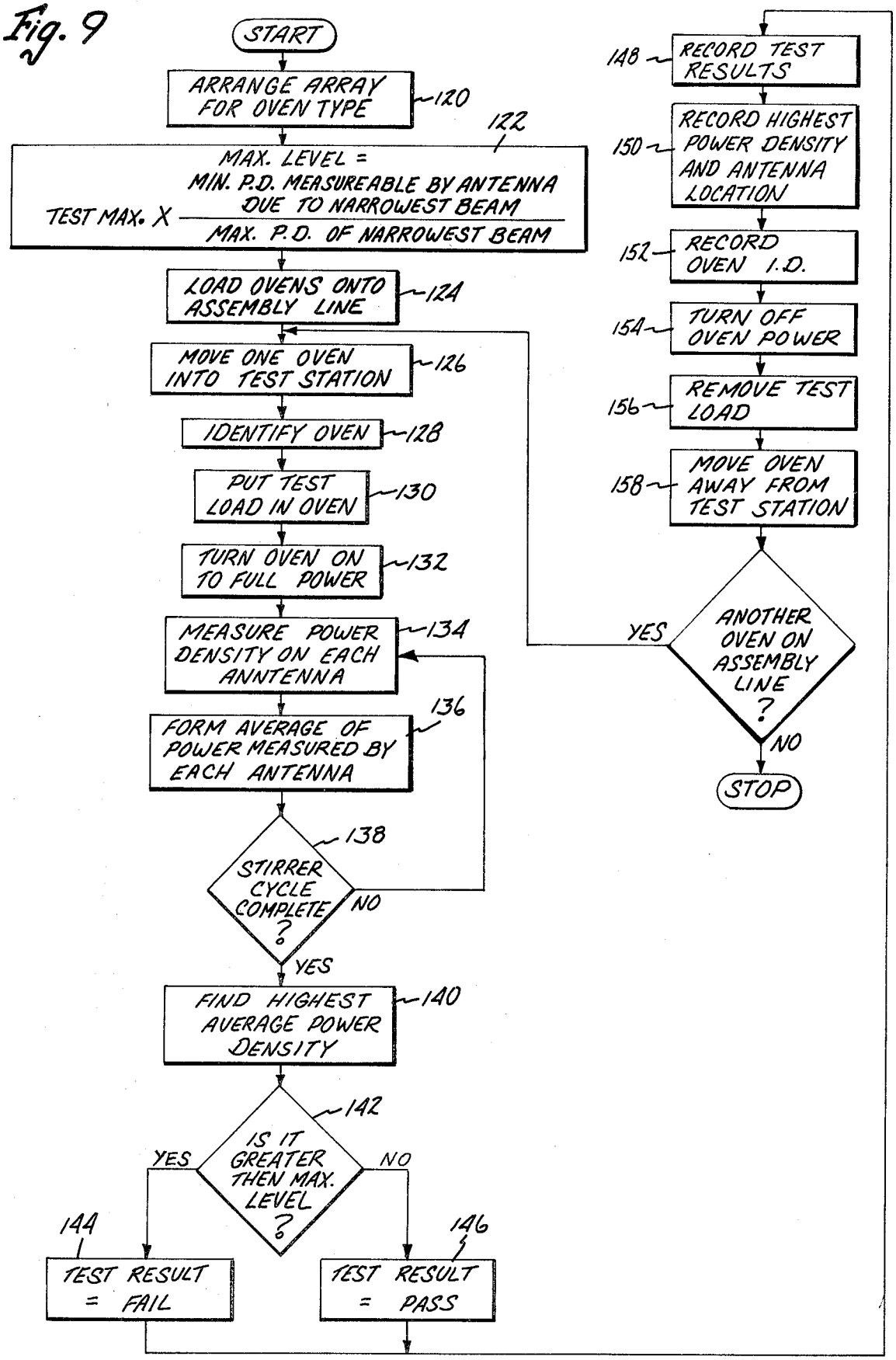

MICROWAVE OVEN LEAKAGE DETECTOR AND METHOD OF USING SAME TO TEST DOOR SEAL LEAKAGE

BACKGROUND OF THE INVENTION

1. Field of the Invention

The present invention relates generally to microwave ovens, and more particularly to apparatus and methods for testing said ovens for microwave leakage therefrom.

2. Brief Description of the Prior Art

Manufacturers of microwave ovens have long been concerned with the problem of containing the microwaves used for cooking food in the oven's cooking cavity. The problem exists because the microwaves used for cooking possess certain frequency and wavelength characteristics that allow them to escape from the cavity through the space remaining between the oven's closed door and the edges of the cavity, however perfect the manufacture has been to eliminate this space. Manufacturers have devised many artful methods and means to assist in sealing the door to prevent microwave leakage; nevertheless, no method or means has yet been devised which is one hundred percent effective.

Moreover, the effectiveness of any door seal arrangement is dependant upon a high quality of manufacture. An error or omission during manufacture of the door seal can reduce or eliminate its effectiveness. This could lead to excessive microwave leakage from the oven. A manufacturer, therefore, has an interest in testing each newly manufactured oven for microwave leakage. Additionally, the U.S. government has also in recent years become interested in assuring that each manufactured microwave oven meets minimum standards for microwave leakage and has specified certain requirements for a leakage test. These requirements currently state that a newly manufactured oven allow leakage no more than one (1) milliwatt per square centimeter as measured at any point five (5) centimeters or more from the oven. The government requirements hereinabove specified, and all further references thereto, are specified by the Bureau of Radiological Health, Department of Health, Education and Welfare in its Regulations for Administration and Enforcement of the Radiation Control for Health and Safety Act of 1968, Section 1030.10.

The prior art has generally included two methods of performing such a door leakage test. The first required slowly passing a mobile microwave sensor, usually hand held, in front and along the periphery of the oven door and measuring the power density of leakage at all points; the second required positioning an array of fixed antennae adjacent to the oven door and measuring each antennae to see if at that point the maximum power density had been exceeded.

The first of the above methods has drawbacks which include: (1) increased time to perform the test over the time required for a fixed antennae system, (2) fatigue on moving parts and wires if the sensor is mechanically moved, and (3) the inevitable inaccuracies resulting from human fallibility if the sensor is hand held.

The second of the above methods has drawbacks related to the array positioning vis-a-vis the oven and the spacing between antennae. The positioning and spacing of the array and antennae is chosen somewhat arbitrarily and provides little or no useful information concerning leakage radiation between antennae. Specifically, prior art antenna arrays provide no means of detecting narrow beams of microwaves emitting from the periphery of the door, let alone determining their maximum power density. These beams, especially very narrow ones, can and do pass between adjacent antennae unnoticed and undetected.

Further, spacing such an array away from the oven further than five centimeters, the test distance required by government standards, in order to detect narrow beams does not provide a satisfactory test method because there exists no means for determining from this "far field" information accurate information concerning the shape and power density characteristics of the "near field" unless both amplitude and relative phase are measured and recorded at each sample point. No practicable instrumentation has heretofore been developed to measure simultaneously both amplitude and phase of the external field of a microwave oven, or, further to compute the field at five centimeters (for example) from the data taken at ten centimeters.

Thus the government has decertified all prior art testing methods using such arbitrarily positioned fixed antenna arrays.

SUMMARY OF INVENTION

The present invention overcomes the difficulties encountered in the prior art devices by providing a fixed antenna array whose position, vis-a-vis the microwave oven door, and antenna spacing are related to the energy distribution of the microwave energy in the oven's cooking cavity. The energy distribution for a given frequency and a given unloaded cavity of simple geometric shape is well known. The energy within the cavity forms into areas of high amplitude and areas of low amplitude due to the phenomenon known as resonance. These resonance patterns, known as modes, along with the shape and position of the emitting aperature(s) define and control the pattern shape and power density of the microwave energy field leakage through the door seals. Once the leakage field pattern has been analyzed for a given microwave oven, an antenna array can be constructed conforming to the pattern to receive and detect the emitting microwaves and provide accurate information concerning their power density.

Specifically, from the cavities internal mode structure and the geometry of the oven near the door/cavity seal where leakage is likely, one may determine the internal mode which will give external fields which vary most rapidly in the spatial coordinates parallel to the face of the oven. (i.e. gives the narrowest beam); moreover, details of the shape of the narrowest beam ($-3$ dB width and null spacing or local minima spacing) are also determined.

From this knowledge there follows several alternative forms of construction and positioning of antenna array that will yield useful information concerning the maximum power density of the emitting field. In a first embodiment, the array is constructed in a line corresponding to the perimeter or the circumference of the door and is positioned in the field of maximum power density propagation (or a known angle relative thereto) at a predetermined distance from the door (the distance being chosen arbitrarily, but it is usually the distance at which test information is desired concerning the power density of microwave leakage; such a test distance is the five centimeters at which the government's requirement of 1 mw/cm$^2$ must be met). The spacing between adjacent antennae is then chosen such that the aforementioned narrowest beam will be detected by at least one of them, and, furthermore, will be detected at a power density which is no less than a known fraction of the maximum power density of that beam. Thus, the resulting antenna array provides an assurance that there are no beams passing through it undetected. Further, assuming that the narrowest beam could emit from anywhere along the door's perimeter and strike at least one antenna at a power density no less than a certain fraction of its maximum power density, the maximum power density possibly emitting from the oven door seals is the highest measured power density multiplied by the inverse of that fraction. For example, if the fraction, is one half, the maximum power density possible will be twice the highest measured power density.

In a second embodiment, the spacing between adjacent antennae is chosen such that, when a given antenna is positioned at the point of maximum power density of the narrowest beam, one of the two adjacent antenna is positioned at the beam's closest minimum (or null point). Thus, the sum of the power densities measured by a given antenna and either of two adjacent antennae must always be equal to or greater than the maximum power density of the narrowest beam provided that the leakage pattern as a function of distance along a straight line in a plane parallel to the face of the oven is a concave down pattern. Experimentally, concave down patterns are always observed. As every beam broader than the narrowest beam will be detected by at least two antennae such that their sum is greater than that beam's maximum power density, the highest sum of any pair of antennae along the array provides an assurance that there is no beam passing through the array having a maximum power density higher than this sum.

These two embodiments may further be varied by dropping the assumption that the narrowest beam could emit from any point along the door's perimeter. The resulting construction would then conform to the expected or calculated field pattern, the antenna spacing varying according to the narrowest beams striking the array at a given portion thereof.

The present invention and other advantages and objects thereof will become more readily apparent in the following detailed description of the preferred embodiment when taken in view of the accompanying drawings, in which like reference numerals refer to like elements throughout the figures.

BRIEF DESCRIPTION OF THE DRAWINGS

FIG. 1 is a perspective view of the front portion of a microwave oven with a linear antenna array positioned in front of the oven at a distance therefrom, the linear array corresponding to the perimeter of the oven's door.

FIG. 2 is a partial cross-sectional view taken along 2—2 of FIG. 1 showing the door seals and a partial cutaway of one antennae of the array.

FIG. 7 shows a perspective view of the front portion of a crossed dipole antenna.

FIG. 9 illustrates the steps of a method to assembly line test microwave ovens for leakage radiation from the oven door.

DESCRIPTION OF THE PREFERRED EMBODIMENT

Figure 3:
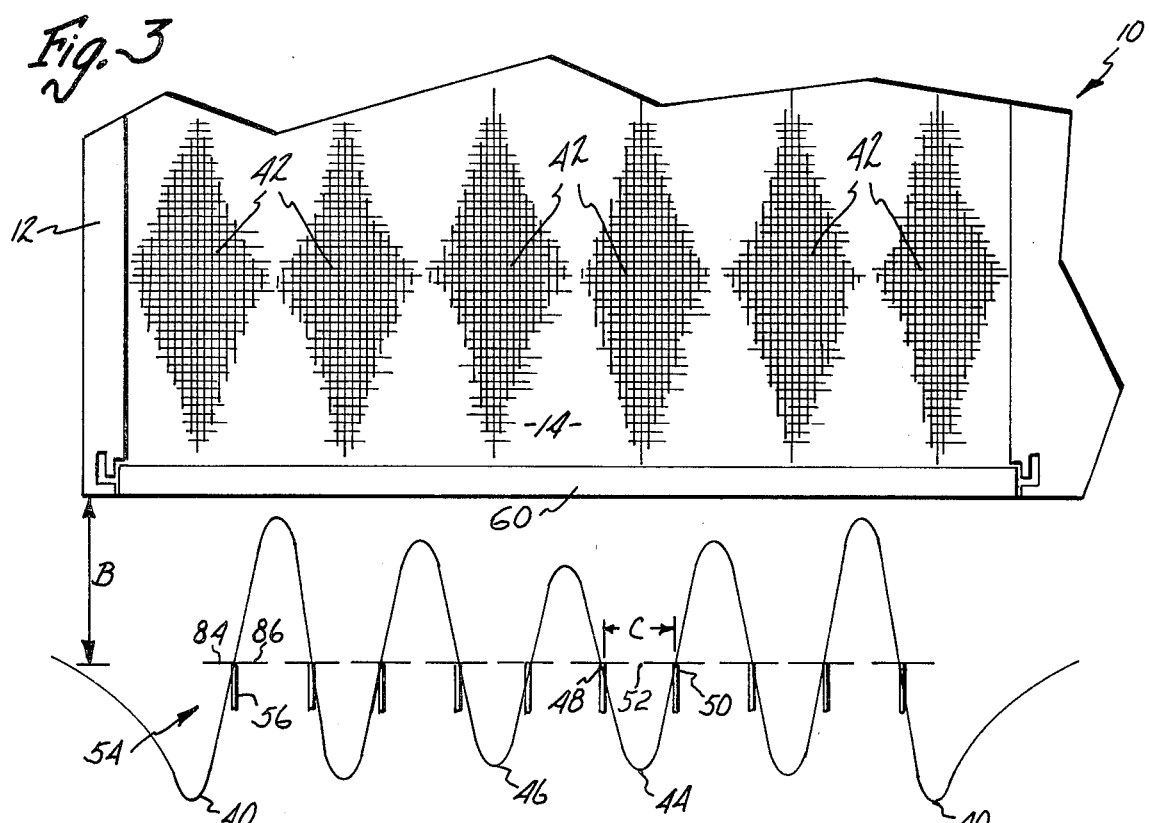
FIG. 3 is a partial cross-sectional view taken along 3—3 of FIG. 1 showing a representation of the forward portion of mode 1,6,2 of microwave energy oscillating in the cavity and a representation of the −3 dB power density contour map of the radiant field and its intersection with the antenna array.

Most microwave ovens have similarities in construction. A typical oven 10 shown in FIG. 4 with its door removed, has a housing member 12, a cooking cavity 14 mounted therein, a door 60 (FIGS. 1 and 3), a microwave generating device, usually a magnetron 18, a waveguide 20 to bring the microwave from the magnetron 18 to the cooking cavity 14, and usually, a mode stirrer 22 mounted at the outlet 24 of the waveguide 20 to disperse the microwaves about the cavity 14 and modify the frequency of microwaves generated by the magnetron 18.

The geometry of the oven cavity 14 and its perturbations along with the position of the mode stirrer 22 determine a set of resonant frequencies. For frequencies in the vicinity of each of these resonant frequencies, the cavity 14 can support oscillating electric and magnetic fields. These fields vary spatially within the cavity and, of course, have a time variation set by the resonant frequency. The spatial variation is characterized by regions of high amplitude oscillation of the electric field and by regions of relatively smaller amplitude of oscillation. The points of highest amplitudes of oscillation are called antinodes and the points of zero amplitude are called nodes.

To better describe this phenomenon, a cartesian coordinate system 16 is chosen. Cavity 14 extends from 0 to a in the x direction, from 0 to b in the y direction and from 0 to d in the z direction.

The resonant frequencies of a rectangular cavity which models the microwave oven is given by $$f_{res} = \frac{V_o}{2} \sqrt{\left(\frac{m}{a}\right)^2 + \left(\frac{n}{b}\right)^2 + \left(\frac{1}{d}\right)^2} \quad (1)$$

where $V_o$ is the free space speed of light and m,n,l are integers.

For a typical microwave oven 10, the cavity 14 has dimensions of a=26 cm, b=40.5 cm and d=41.5 cm. For a given microwave frequency, 2450 MHZ and a bandwidth of ±50 MHZ, the only resonant frequencies are:

| m | n | l | F (m,n,l) |
|---|---|---|-----------|
| 4 | 2 | 1 | 2448.8 |
| 4 | 2 | 0 | 2422 |

-continued

| m | n | l | F (m,n,l) |
|---|---|---|-----------|
| 4 | 1 | 2 | 2448.3 |
| 4 | 0 | 2 | 2416 |
| 2 | 5 | 3 | 2434 |
| 2 | 3 | 5 | 2413 |
| 2 | 1 | 6 | 2482 |
| 2 | 0 | 6 | 2454 |
| 1 | 6 | 2 | 2405 |
| 1 | 5 | 4 | 2417 |
| 1 | 4 | 5 | 2405 |
| 0 | 6 | 3 | 2471 |
| 0 | 3 | 6 | 2435 |

Figure 4:
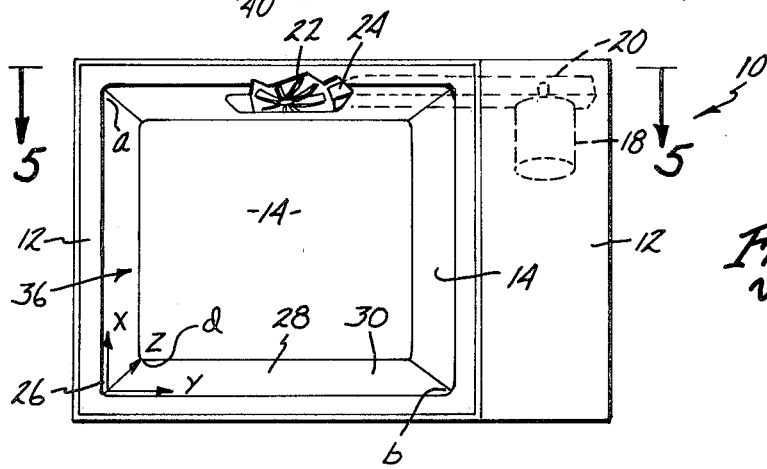
FIG. 4 is a front plan view of a microwave oven with its door removed and having a partial cutaway showing a mode stirrer. Also shown by the dotted lines are a magnetron and a waveguide. Coordinate system x,y,z has its origin at the front bottom left of the cooking cavity.
Figure 5:
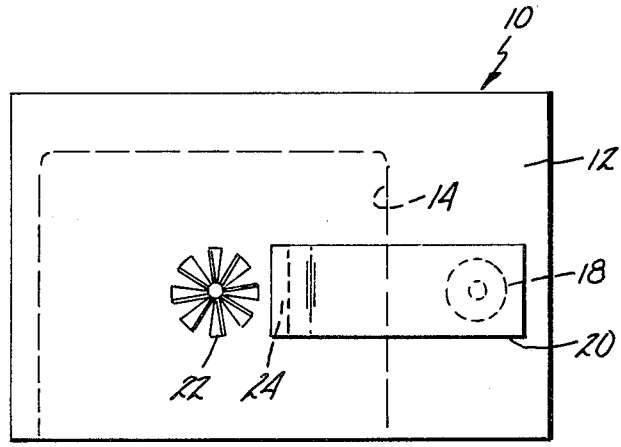
FIG. 5 is a view of the microwave oven taken along 5—5 of FIG. 4.
Figure 6A:
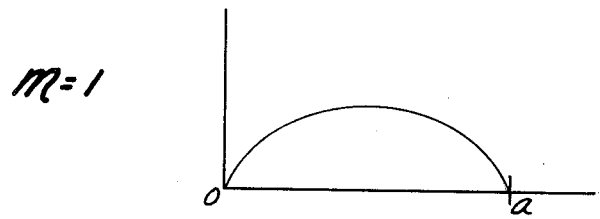
FIG. 6 shows an instantaneous representation of resonance mode 1,6,2 in each of three dimensions.
Figure 6B:
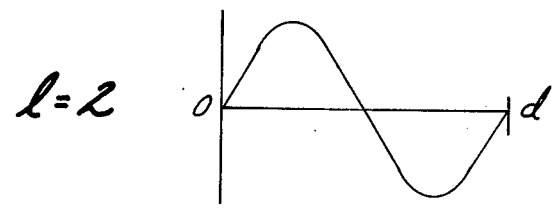
Figure 6C:
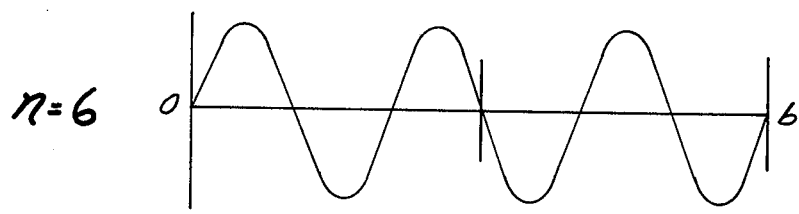

The physical meaning of the integers m,n,l is that in the corresponding cavity dimension there are that many half wavelengths, as can be seen from FIG. 6, which is a representation of the 1,6,2 resonance mode. FIG. 6a. shows the oscillation in the x direction (m=1); FIG. 6b. the oscillation in the z direction (l=2), and FIG. 6c. the oscillation in the y direction (n=6). The corresponding wavelengths are in the x direction: 52 cm, in the z direction: 41.5 cm, and in the y direction: 13.5 cm. These cavity wavelengths are all greater than the free space wavelength for that frequency and are related by the equation:

$$\frac{1}{\lambda x^2} + \frac{1}{\lambda y^2} + \frac{1}{\lambda z^2} = \frac{1}{\lambda o^2} \quad (2)$$

Wherein $\lambda x$, $\lambda y$, $\lambda z$ are the wavelengths in the x,y and z directions respectively, and $\lambda O$ is the free space wavelength. Substituting the above determined cavity wavelengths in this equation yields a free space wavelength of 12.463722 cm. A two dimensional representation 42 of this mode is shown in FIG. 3, which shows a view of a cross section of the front of the cavity 14 seen from above. The centers of each antinode 42 are to be viewed as more dense than the fringe portions thereof.

A characteristic of resonant frequencies is that the impedance seen by the magnetron 18 is much lower for them than for non resonant frequencies. Indeed, the impedance for some non resonant frequencies may be nearly infinite. In a steady state condition, therefore, far more resonant frequency energy is present in the cavity 14 than non resonant frequency energy.

It follows that any energy leaking from the cavity through the door seals 72 and 74 is likewise due to the fields of the resonant modes of the cavity 14. These resonant modes have fields which are spatially arranged into patterns of high amplitude and low amplitude. Leakage occurs through gaps which are excited by these internal fields. Leakage energy upon reaching the outer portion 63 of the perimeter of the door radiates into space; the gap 65 between the outer portion 63 of the door 60 and the housing member 12 acting as an antenna. From the internal field distributions due to a given mode or set of modes, one may determine the pattern of leakage energy present at this gap 65. From this pattern, one may determine the shape and power density characteristics of the external field.

From the knowledge of the shape and power density of the external fields, a plurality of fixed antennae may be placed a predetermined distance (5 cm) and angle from the gap 65 and spaced a predetermined distance apart so as to insure that the narrowest beam of radiation will be detected by at least one antenna. The antenna spacing may be further specified to provide information concerning the maximum power density of this narrowest beam. For example, a spacing may be chosen such that the beam must be sensed by a least one antenna at a power density no less than a predetermined power density, such as −3 dB, from the maximum power density of the beam. The predetermined, power density ratio (where the minimum power density of the narrowest beam is sensed) occurs when the peak or maximum power density of the narrowest beam lies between two adjacent antennae and each antenna is sensing the same power density. A second example of specifying antenna spacing is requiring that if an antenna is sensing the minimum (null point) closest to the peak, an adjacent antenna must sense the peak power density of the narrowest beam. From this information one can state that the peak or maximum power density must be equal to or less than the sum of the power densities measured by those two adjacent antennae, provided the pattern is concave down.

The above principle of specifying an antenna spacing may be extended to the combinations of one or more antennae such that curve fitting techniques may yield information concerning the maximum power density of the narrowest beam of emitting leakage radiation. However, an antenna spacing so large as to allow adjacent antennae to simultaneously sense a given narrowest beam's minima (null points) will provide little (or no) useful information.

The first of the above examples of antenna spacing can be better appreciated by reference to FIG. 3, which shows a cross section of the front portion of the oven 10, a representation of the electrical field cavity distribution pattern 42 of the 1,6,2 mode, an antenna array 54, and a power density contour map 40 of the emitting field taken at −3 dB from peak power density. (This dB level is arbitrarily chosen, primarily for its practicality). The central beams of the field 42 are more narrow than the outer beams. The two central beams 44 and 46 are the narrowest possible for an oven 10 having a maximum number of antinodes in the y direction of 6 (n=6). Antennae 48 and 50 detect beam 44 at equal power density, both at −3 dB from the peak power density. The peak power density occurs at or near the midpoint 52 between the antennae 48 and 50. It may be appreciated that −3 dB is the minimum power density that will be sensed by at least one of the two antennae 48 and 50, for if the beam 44 was shifted slightly to one side or the other, one of the antennae 48 or 50 will sense a higher power density while the other will sense a lower. With the antenna spacing C chosen as in FIG. 3, one may state that the narrowest beam of radiation 44 will be measured by at least one antennae 56 of the antenna array 54 at a power density of no less than −3 dB from its peak or maximum power density. Should the antenna spacing C be chosen narrower from that shown in FIG. 3, the narrowest beam will be detected, at a minimum, at a correspondingly higher power density in relation to its peak or maximum power density.

Information concerning the maximum power density of the narrowest beam of emitting microwaves provides a method for guaranteeing that the microwave oven 10 is not emitting microwaves from its door gaps 65 at more than a certain maximum power density at a predetermined test distance B, which is usually the government specified five centimeters. Every beam broader than the narrowest beam must be measured by at least one antenna 56 of the array 54 at a power density closer to its peak power density than that minimum power density (−3 dB) guaranteed for the narrowest beam (or at a power density less than or equal to the summation of the power densities measured by that antenna and either of two adjacent antennae if the minima peak spacing is employed). Thus, assuming the narrowest beam could emit from anywhere along the gap 65 and strike two adjacent antennae 56 in the array 54 at the minimum power density, and further assuming the narrowest beam is also the most powerful, the maximum power density of emitting microwaves must be less than or equal to the highest measurement taken from any antenna 56 along the array 54 multiplied by the inverse of the ratio of the minimum power density at which the narrowest beam will be measured and that beam's maximum power density. If −3 dB is the minimum power density at which the narrowest beam will be measured, the ratio of this to the beam's maximum power density is (approximately) ½. In a leakage test, then, the maximum possible power density of emitting microwaves would be the inverse of this ratio (2) times the highest actually measured power density.

Magnetrons used in microwave ovens generally have an unloaded bandwidth at 2450 MHz of 5 MHz. The operating frequency of the magnetron can be made to vary depending on the impedance placed upon its output. A mode stirrer, positioned in front of the waveguide outlet port, varies the impedance, as do the resonance characteristics of the cavity. The magnetron seeing a varying impedance at its output generates a frequency spectrum wider than its unloaded bandwidth, but usually no more than 40 MHz. Regardless, it is desirable from a cooking standpoint to generate as wide a frequency spectrum as possible so as to excite as many resonant modes as possible. This will more uniformly space about the cavity, on a time average basis, the nodes and antinodes due to the resonant modes and provide more even cooking.

Once an operational bandwidth is determined, one may calculate from equation (1) all n,m, and l which will yield a resonant frequency within that bandwidth. Then one uses the highest m or n to calculate the power density characteristics of the external field. From this information, one may determine the appropriate antenna spacing at a predetermined test distance and angle from the door gap 65. The calculation is only rough and must be refined by actual measurements using the chosen mode. For example, with an oven of the dimensions mentioned above, the calculation yielded a 3.5 cm, −3 dB beamwidth while experiment indicated a minimum −3 dB beamwidth of 3 cm at an antenna to oven separation of 5 cm and angle of 0° from the direction of maximum power density propagation.

The external field emitted from slots or gaps in the walls of a resonant cavity having a specified resonant frequency oscillating therein may be calculated using an equivalence theorem, assuming that the gaps do not appreciably disturb the interior fields. That the gaps through which the microwave energy leaks are indeed minor perturbers of the internal fields is evidenced by the low level of the fields observed externally relative to those present inside the cavity. Measurements indicate that the total emitted power from a microwave oven is less than a few hundred milliwatts while the available power inside is about 650 watts. This implies an isolation between the inside and the outside of at least 30 dB for a properly operating oven. When this isolation has degraded (leakage increased) to 20 dB the coupling between the outside and inside is still very slight. Hence it is fair to say that for an oven with no gross mechanical defect (eg. door screen missing) the internal fields are not strongly affected by the presence of the gaps through which the leakage occurs.

Such an equivalance theorem is illustrated in R. F. Harrington, *Time Harmonic Electromagnetic Fields* (New York: McGraw-Hill, 1961), pp. 110–111. A better approximation can be obtained from the Bethe hole theory. C. M. Butler, et al., "Electromagnetic Penetration Through Apertures in Conducting Surfaces", *IEEE Transactions on Antennae and Propagation*, Vol. AP-26, No. 1 (January, 1978), pp. 82–93. The equations developed below are for the first of the above methods. These equations, developed for radiation coming directly from the gaps in the wall, may be adapted with some difficulty to an actual microwave oven configuration wherein the gaps coupled to channels 70 (which can be viewed as waveguide structures) between the door 60 and housing member 12 to emit from the oven along the exterior gap 65. The measurements taken and the calculations performed, show that the more simple model is adequate to determined the shape of the narrowest beam in the oven's leakage pattern.

Figure 10:
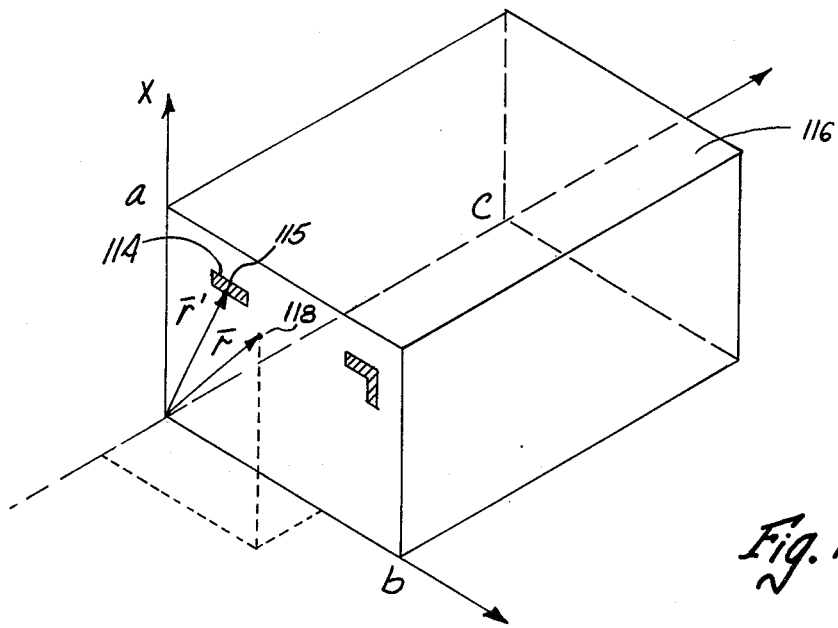
FIG. 10 shows a three dimensional representation of an oscillating cavity having linear apertures or gaps therein, a coordinate system and two position vectors.

From Harrington, supra, equation 3–17 describes the external magnetic field.

$$\overline{H}(\overline{r}) = -\overline{\nabla} \times \iint_{gap2} \frac{e^{-jK_o |\overline{r} - \overline{r}'|}}{\pi |\overline{r} - \overline{r}'|} \overline{H}(\overline{r}') \times \hat{N} \, ds' \qquad (3\text{-}17)$$

Where $\overline{r}$ (FIG. 10) is a position vector of a point 118 in the external field, $\overline{r}'$ is a position vector of a point 115 along the wall gap 114, $\hat{N}$ is the outward normal to the cavity 116, $K_o = 2\pi/\lambda_o$, $\lambda_o$ being the free space wavelength of the resonant frequency, $ds'$ is an incremental area of the gap 114, and $\overline{H}(\overline{r}')$ is the magnetic field inside the cavity at $\overline{r}'$. The radiant electric field may be found by taking the curl of $\overline{H}(\overline{r})$ $$\overline{E}(r) = \frac{1}{jw\epsilon} \overline{\nabla} \times \overline{H}(r) = \frac{\sqrt{\mu/\epsilon}}{j\lambda_o} \overline{\nabla} \times \overline{H}(\overline{r})$$

Expansion of this curl yields the following:

$$\overline{E}(r) = \frac{-\sqrt{\frac{\mu}{\epsilon}}}{2Hjk_o} \iint_{gaps} \left[ (H_y(\overline{r}') \hat{x} + H_z(\overline{r}') \hat{y}) k_o^2 \frac{e^{-jk_o|\overline{r}-\overline{r}'|}}{|\overline{r} - \overline{r}'|} \right.$$

$$\left. -H_y(\overline{r}')(x - x') \frac{e^{-jk_o|\overline{r}-\overline{r}'|}}{|\overline{r} - \overline{r}'|^5} [(x - x')\hat{x} + (y - y')\hat{y} + (z - z')\hat{z}] \right.$$

-continued $$-H_y(\vec{r'}) \left( \frac{1}{|\vec{r}-\vec{r'}|} + jk_o \right)^2 \frac{(x-x')e^{-jk_o|\vec{r}-\vec{r'}|}}{|\vec{r}-\vec{r'}|^3} [(x-x')\hat{x} + (y-y')\hat{y} + (z-z')\hat{z}]$$

$$+H_y(\vec{r'}) \left( \frac{1}{|\vec{r}-\vec{r'}|} + jk_o \right) \frac{e^{-jk_o|\vec{r}-\vec{r'}|}}{|\vec{r}-\vec{r'}|} \left[ \frac{\hat{x}}{|\vec{r}-\vec{r'}|} - (x-x') \left( \frac{(x-x')\hat{x} + (y-y')\hat{y} + (z-z')\hat{z}}{|\vec{r}-\vec{r'}|^3} \right) \right]$$

$$+H_z(\vec{r'}) (y-y') \frac{e^{-jk_o|\vec{r}-\vec{r'}|}}{|\vec{r}-\vec{r'}|^5} [(x-x')\hat{x} + (y-y')\hat{y} + (z-z')\hat{z}]$$

$$+H_z(\vec{r'}) \left( \frac{1}{|\vec{r}-\vec{r'}|} + jk_o \right)^2 \frac{(y-y')}{|\vec{r}-\vec{r'}|^3} [(x-x')\hat{x} + (y-y')\hat{y} + (z-z')\hat{z}] e^{-jk_o|\vec{r}-\vec{r'}|}$$

$$-H_z(\vec{r'}) \left( \frac{1}{|\vec{r}-\vec{r'}|} + jk_o \right) \frac{e^{-jK_o|\vec{r}-\vec{r'}|}}{|\vec{r}-\vec{r'}|} \left[ \frac{\hat{y}}{|\vec{r}-\vec{r'}|} - \frac{(y-y')[(x-x')x + (y-y')\hat{y} + (z-z)\hat{z}]}{|\vec{r}-\vec{r'}|^3} \right] \right] dx' dy'$$

Where Hy(r̄) and Hz(r̄) are the components of H(r̄') in the respective directions; (x−x')x̂, (y−y')ŷ and (z−z')ẑ are directional components of position vector r̄−r̄' in the respective directions; and $\mu$ is the permeability constant and $\epsilon$ is the permittivity constant.

The above equation is too complex to be evaluated analytically in terms of elementary functions. Numerical evaluation must be used. Once the external electric field has been determined the equivalent far field power density can be determined from the strength of the electric field using $$W = \frac{|\overline{E}|^2}{2 n_o}$$

where $n_o$ is the impedance of free space ∼377 ohms and the factor of ½ arises from the use of peak values for the vectors representing the fields and W is the power density in Watts/m².

Having determined the power density of the external field for a particular microwave oven (refined experimentally using the mathematical result as a roadmap), one may determine for the narrowest beam thereof an antenna spacing (at a predetermined distance from the oven at a predetermined angle relative to the direction of maximum power density propagation) that will sense the power density of the beam at a known minimum power density from the peak or maximum power density of the beam. One may alternatively determine an antenna spacing equal to the distance from the narrowest beam's peak or maximum power density and its closest minima (null point). Having determined the desired antenna spacing, one then specifies the final form and position of an array of antennae such that the antennae scan the entire perimeter of the oven door.

It is appropriate to note at this point that a small (in terms of free space wavelength) fault or gap in an oven door seal which allows substantially more power to emit from the oven cavity at that point will not generate external fields with a beam narrower than the aforementioned narrowest beam because only an antenna having rapidly varying electric fields along its length can generate narrow beams in the near field. A point or a small length radiator will generate a relatively broad beam.

Furthermore, the presence of a mode stirrer 22 or a test load (not shown) in the oven will not alter the determination of the narrowest beam. A stirrer 22 causes localized creation of higher modes than the theoretical modes for the bandwidth. However, these higher modes will not propagate in the cavity 14 and are greatly attenuated by the time they reach the vicinity of the oven door 60. Viewing the cavity as a waveguide in the direction toward the door 60, the propagation of waves is governed by an attenuation multiplier exp($\pm T_{mn}Z$) where $$T_{mn} = \sqrt{\left(\frac{m\pi}{a}\right)^2 + \left(\frac{n\pi}{b}\right)^2 - w^2\mu\epsilon}$$

where m,n,a,b,$\mu$,$\epsilon$ are defined supra, and $\omega$ is $2\pi f$, f being the frequency. For f>2500 MHz, $T_{mn}$ is imaginary for all propagating low order modes. For m=o and n=7, the next higher mode after 1,6 with a=20 cm and b=40.5 cm, $T_{07}$ is equal to 0.1438/cm. The distance from the mode stirrer 22 (z=41 cm) to the door 60 is approximately 17 cm. At that distance, attenuation is 21 dB. As m,n increase for modes higher than 0.7 attenuation will correspondingly increase.

It has also been experimentally determined that the presence of the government required test load of 275±15 milliliters of water in a low form 600 milliliter beaker placed in the center 28 of the oven does not fundamentally alter the mode structure at the oven door 60. It does, however, lower the strength of the electric field present in the cavity, which is to be expected. The only requirement necessary for the leakage calculation performed above is that the cavity 14 be rectangular in the vicinity of the door 60.

Having determined the appropriate antenna spacing, the form of construction of an antenna 54 array depends primarily upon the arrangement of the door 60 vis-a-vis the oven housing member 12. In a Litton 500 series oven 10, the door 60 and housing member 12 are arranged so that the perimeter of the door 62 is spaced from a flange extension 66 of housing member 12 and runs parallel thereto for a short distance to form a channel 64. This channel 64 causes emitting microwaves to be directed as shown by the arrows 68 in FIG. 2. Thus, the appropriate location of an antenna 56 is centered along the direction of propagation of maximum power at a predetermined test distance B therefrom, usually the government's 5 centimeters.

Shown also in FIG. 2 are cavity 14 in which the microwaves oscillate, gap 70 between door 60 and housing member 12 through which microwaves leak from cavity 14, and two typical sealing devices, a quarterwave choke 72 and a resilient conducting plug 74.

The quarterwave choke 72 is well known. It operates by reflecting microwaves back to the entrance 78 of gap 70. As the path length from the point of reflection 76 to the gap entrance 78 is one half wavelength (for a given frequency), an incoming wave will be 180° out of phase with a reflected wave so that the resulting electric fields at all points in gap 70 will be zero. The quarterwave choke 72, dependant as it is on wavelength and therefore on frequency, is most effective at a predetermined frequency, chosen to choke off the highest power density mode existing in a loaded cavity 14. However, it is still very effective for all frequencies in the bandwidth, being gradually less effective the further the frequency is away from the predetermined frequency.

The secondary sealing device shown in FIG. 2 is the resilient conductive plug 74. Being conductive at all points, it operates as an electrical short which is not frequency dependent.

The combination of the choke 72 and the plug 74 is very effective to suppress microwave leakage. Normally far less than the government maximum of 1 milliwatt/$cm^2$ escapes from the oven. However, imperfections in materials or manufacture may cause the leakage to exceed this standard. Even so, no imperfection can be hypothecated that will yield a narrower beam of radiation than the predetermined narrowest beam since all such imperfections in manufacture create gaps which are driven by the resonant modes inside the cavity. These resonant modes are the primary constraint on the minimum beamwidth of the external fields.

Figure 8:
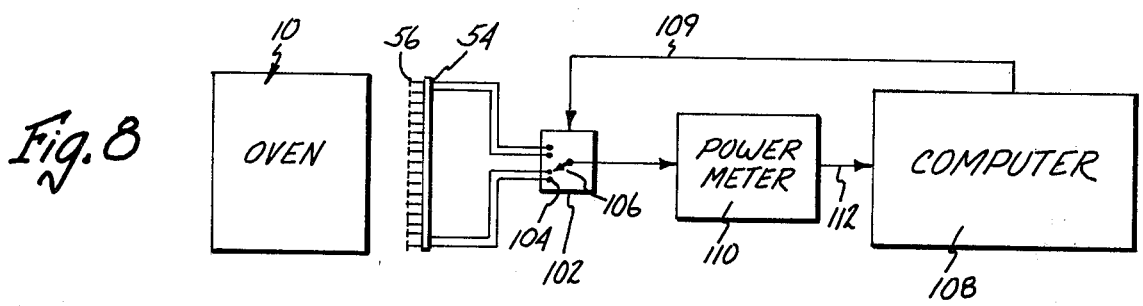
FIG. 8 shows a schematic representation of an oven, a test antenna array, a commutator, a power meter and a computer.

The antennae 56 should be as small as possible so as not to distort the external field. The antenna 56 used in the preferred embodiment is a conventional crossed dipole. The antenna 56 has a vertical member 82 and a horizontal member 84 for detecting the correspondingly directed electric fields. Both are electrically connected to shield 94. The members 82 and 84 have their opposite poles 86 and 88 grounded and electrically separated therefrom by quarterwave slots 90. The length of these members 82,84,86 and 88 is considerably less than the free space wavelength $\mu o/2$. The smaller these arms, the less the field is perturbed. The two operating members 82 and 84 are wrapped in an insulating material 92, and are carried coaxially through antenna shield 94 into array frame 96. Support 98 holds the antenna 56 rigid and directed toward gap 65. Each wrapped member 82 and 84 are then lead to a nearby hollow frame support 100, carried coaxially therethrough into commutator 102 (shown functionally represented in FIG. 8) and terminated in commutator posts 104.

The commutator selection arm 106, controlled by computer 108 through control function 109, sequentially selects each commutator post 104 and thereby each member 82 and 84 of each antenna 56 of antenna array 54. The preferred commutator 102 is a conventional diode matrix.

Selection arm 106 is coupled to power meter 110, which in the preferred embodiment is a conventional analog to digital converter.

The output 112 of the power meter is coupled to the computer 108 which receives, remembers, and performs calculations upon the power sensed by each operating antenna member 82 and 84.

The scheme for sensing the microwaves described above uses one microwave detector (in the power meter 110) sequentially switched among many antennae. This scheme has the advantage of having only one temperature sensitive component (the single detector). Detectors may be placed directly at the antennae and the output of each detector sequentially sampled by the commutator switch. The averaging means may be incorporated before or after the commutator switch. If placed after the commutator the averaging would be performed by the computer program. If before, the averaging would be performed by a simple R.C. integrator.

As noted above, the configuration of the array depends upon the construction of the microwave oven 10, as varying door mounting methods will vary the direction of maximum power of propagation of the radiating microwaves. For a Litton 500 series oven 10, antennae 56 are housed in frame 54 and aligned in a plane 5 centimeters from the front of the oven 10, the antennae being arranged in the plane along a line substantially congruent with the gap 65 between the housing member's 12 flange extension 66 and the perimeter 63 of the door 60. Hollow support posts 100 hold frame 96 at the position indicated. These posts 100 may conveniently be mounted on either a fixed platform (not shown), in which an oven 10 to be tested is moved to a position 5 centimeters from the antennae 56, or on a movable platform (not shown), in which frame 96 can be moved to the proper position vis-a-vis the oven 10.

If flange extension 66 is not present and door 60 is extended to the top edge 13 of housing member 12 (a common form of construction), microwaves will radiate from gap 70 directly upwards. If the door of the oven to be tested is similarly constructed on all four sides, the test frame is constructed to provide a frame lying in a plane running through gaps 70 on all four sides of oven 10, and housing a plurality of inwardly pointing antennae which form a line in said plane 5 centimeters from the circumference of the gap 70.

Regardless of the particular form of constructions, an antenna 56 must be placed at every point along the gap 65 a predetermined test distance (5 centimeters) therefrom and spaced a predetermined distance from each adjacent antenna 56 so as to generate data concerning the electric fields radiating from the gap 65 which may be used to compute the peak or maximum power density of the narrowest beam emitable or emitting from the gap 65.

Once the form of antenna array has been specified for a given oven, the array may be used as a component in a method for rapidly testing newly manufactured microwave ovens for microwave leakage. Most current tests are performed manually and take up to five minutes per test and may require three operators. An automated method, using an antenna array, can be expected to reduce this test time and require, at most, only one operator.

Referring to FIG. 9, a flow chart of a preferred form of the method is shown. The first step 120 is the arrangement of the array according to oven construction. Next, a maximum power density level that will pass the test is computed 122.

Generally speaking, the test that must be passed is the government specified standard of no greater than 1 milliwatt per square centimeter at 5 or more centimeters from the oven under test. However, manufacturers commonly set more stringent standards than this to provide an extra margin of safety. Regardless, if the array 54 is constructed such that at least one antenna 56 thereof must sense a narrowest beam emitting from the door gap at a power level no less than a certain known decibel level less than that beam's maximum power density, then, this minimum sensible power density forms a ratio with the maximum power density. This ratio is a multiplier by which the test standard must be multiplied to yield a maximum level which cannot be exceeded by any antenna 56. For example, if the minimum power density at which the narrowest beam will be measured is $-3$ dB from the maximum measurable power density, a reading of 0.5 mw/cm$^2$ upon an antenna means that if that antenna were sensing the narrowest beam at that minimum power density, the peak or maximum power density of the beam would be exactly double this value or 1 mw/cm$^2$ ($-3$ dB is the half power level). If the antenna sensed the beam at a power density less than this minimum, the antenna spacing guarantees that an adjacent antenna must sense the beam at a power density greater than this minimum. The worst case, therefore, is where both adjacent antennae sense the narrowest beam at an equal power density, which, due to the antenna spacing, is no less than the aforesaid minimum power density from the peak or maximum power density. To pass the test of 1 mw/cm$^2$ or less, every antenna on the array must sense a power density of 0.5 mw/cm$^2$ or less.

In alternative embodiments, the maximum power density level of a narrowest beam would be computed from a plurality of antennae using curve fitting techniques, one of which was described above, that is, two sets or pair of adjacent antennae 56 are summed to form a power density which must be greater than or equal to the peak or maximum power density of a narrowest beam. This sum, then, must be less than the test standard for any set or pair of antennae 56 on the array 54. Thus, in this alternative, the test standard itself is the maximum level.

The next steps in the method are to load 124 (if they have not already been loaded) the ovens 10 to be tested onto an assembly line and to move 126 them one at a time to a test station (not shown) generally described as an area adjacent to the antenna array 54. There the oven 10 to be tested (if it has not already been identified) is identified 128 by an operator, usually by a production number.

The operator then places 130 a test load (not shown) in the oven. Government regulations currently require a load of 275±15 milliliters of tapwater in a low form, non conductive 600 milliliter beaker having a diameter of approximately 8.5 centimeters. The water must have an initial temperature of 20°±5° celsius. The load is placed in the center 28 (FIG. 4) of the load carrying surface of the oven 10.

Next the oven is turned on at full power 132. At full power, new high-powered ovens reach the boiling point of the test load in such a short time as to require that the load be replaced three or more times during the running of a manual test. The speed of the present method using an antenna array 54 will eliminate the need for these replacements.

The oven door 60 is then closed and the oven 10 (or the antenna array 54) is positioned to the proper distance and alignment vis-a-vis the antenna array 54 (or the oven 10).

A computer 108 then is commanded to start measurements 134. It sequentially measures 134 each antenna operating member 82 and 84 of each antenna 56 of the array 54 by means of the commutator 102. The power sensed by each antenna operating member 82 and 84 is coupled individually and sequentialy into a power meter 110, which includes an analog to digital converter. The digital information for each antenna operating member 82 and 84, plus its address, is remembered by the computer 108, and on subsequent passes is updated 136 to form an average. The computer 108 repeats the measuring of the antennae 56 until a predetermined number of repetitions have been performed or until a timer interrupts the process, both of which indicate that the oven stirrer 22 has completed one cycle 138. (A cycle for a single rotor stirrer 22 is a rotation through 360°. The time it takes for one cycle depends upon the stirrer's r.p.m.).

The test must be performed over one stirrer cycle because the stirrer 22 causes the excitation of different modes depending upon its orientation with respect to the waveguide outlet port 24. To test for leakage for all possible frequencies and modes, one must continue the test for every orientation of the stirrer 22. Furthermore, the aforementioned government standards require that the test be performed through at least one stirrer cycle. These same standards permit an averaging of the power density data which may also be implemented into the signal processing routine inside the computer 108.

At the end of the stirrer cycle, the computer 108 scans 140 the information remembered for each antennae 56 and determines 142 for any one (or set) whether the predetermined maximum power density level 122 has been exceeded. If it has 144, the computer records 148 (or displays to the operator for him to record) a fail indication. Similarly, the identification 152 of the oven 10 (if not already recorded) is recorded 150 along with the location of and the power density level of the antenna having the highest measured power density.

The oven's power is then turned off 154, the test load removed 156, the oven moved away from the test station 158 and another untested oven moved in and the test procedure repeated thereon until all ovens on the assembly line have been tested 160.

This completes a description of the preferred embodiment and an alternative thereto. Various modifications may be made to the specifications above-enumerated without departing from the scope and spirit of the present invention. It may also be appreciated that while the above specification has been confined to the field of microwave ovens, the principle of using a determination of the near field emitting from gaps in a cavity having electromagnetic energy of predetermined frequencies oscillating therein to define an antenna spacing and positioning which can yield information concerning the electric field (power density) strength of specified beams of emission is a general one and may be used in any application wherein one wishes to test for leakage from a cavity oscillator, rectangular or not, but having known internal electromagnetic fields near the gap (or gaps). It may further be appreciated that the uniform antenna spacing of the preferred embodiment was predicated upon the assumption that the narrowest beam could emit from any point along the aperture 65. This assumption is not necessary through, and the probable location of the narrowest beam can be well defined using mathematical methods. This being the case, the antenna spacing can be made to vary according to the expected narrowest beams striking a given portion of the array. As the narrowest beams are found near the center of a linear aperture, substantially as shown in FIG. 3, and broader beams found near the edges, the antenna spacing would be narrower near the center and correspondingly broader near the edges. Likewise, the mode pattern exciting the gap 65 varies according to the side of the oven the gap 65 is on. The antenna spacing can be made to vary accordingly. Further extensions of varying antenna spacing can be made to arbitrary gap shapes and cavity construction, the only limit being the complexity of the resulting mathematical equations.

Wherefore, in light of the above specification,

What is claimed is:

1. A method for determining the maximum possible power density of microwave leakage from a microwave oven in the region of the microwave oven door comprising the steps of:
   (A) arranging a plurality of microwave sensitive antennae in a linear array, said array having a configuration corresponding to at least one edge of the circumference of said oven door, each of said antennae being spaced from each adjacent antenna a predetermined spacing distance, said spacing distance being equal to or less than the beamwidth corresponding to the highest mode of standing wave resonant energy in the oven whereby the narrowest beam of energy leaking from any aperture along said door edge of an oven being tested will be sensed by at least one of said antennae;
   (B) positioning an oven to be tested adjacent to said array by:
      i. paralleling said oven door edge at a predetermined distance to said array, and
      ii. orienting said oven door edge to said array at a predetermined angle relative to the direction of maximum energy propagation from said oven door edge;
   (C) measuring the microwave power density sensed by each antenna, and
   (D) determining from said measurements the maximum possible power density of leakage at any point along said array.

2. The method of claim 1 wherein step (B) includes positioning said oven a predetermined test distance from said array and wherein said predetermined spacing distance is less than the shortest distance between the minima on a power density contour map of microwave leakage beams leaking from a fully energized oven at said predetermined test distance and angle, where the beamwidth of said microwave leakage beams is determined principally by the highest mode of resonant energy inside the oven cavity.

3. The method of claim 2 wherein step (D) includes:
   i. predetermining a minimum power density greater than any of the local minima in the power density contour map so as to be measurable by at least one of said antennae when measuring a microwave leakage beam of energy corresponding to a half wavelength of the highest mode of standing wave resonant energy in the oven,
   ii. determining the highest power density measured by any antenna, and
   iii. determining the maximum possible power density of microwave leakage by assuming said highest power density measured is taken from an antenna sensing said predetermined minimum power density of said microwave leakage, the result being the maximum power density possible at any point along said array.

4. The method of claim 2 wherein said predetermined spacing distance is the distance between the peak power density and the closest minima of said narrowest microwave leakage beam at said predetermined test distance and angle; and wherein step D. includes:
   summing the power density sensed by each pair of adjacent antennae; and determining the highest of said sums, the result being the maximum possible power density at any point along said array.

5. The method of claim 3 wherein step D. includes providing a fault indication when said maximum possible power density has exceeded a predetermined microwave power density leakage level.

6. The method of claim 3 further including placing a predetermined test load in the oven before performing step C.

7. The method of claim 1 or claim 2 or claim 3 or claim 5 or claim 6 wherein step C. is performed a predetermined length of time and an average power density is determined before performing step D.

8. The method of claim 7 wherein there are further included the steps of
   (E) mounting one or more ovens to be tested upon an assembly line;
   (F) moving said one or more ovens to be tested one at a time to a test station;
   (G) turning on to full power an oven present at said test station before performing step C;
   (H) moving said oven present at said test station away therefrom at the completion of step D; and
   (I) repeating steps F through H until there are no more ovens on said assembly line to be tested.

9. The method of claim 8 further including recording the identity of the oven tested and the results of step D. before performing step I.

10. The method of claims 1 or 2 or 3 or 5 or 6 further including recording the identity of the oven tested and recording the results of step D.

11. A microwave oven door seal power density leakage detector for detecting power density of a beam of microwaves leaking through a seal along the perimeter of the oven door, said microwave leakage beam having a direction of maximum power density propagation, said leakage detector comprising:
   a plurality of microwave sensitive antennae, arranged in alignment with a segment of the perimeter of said door in a linear array and spaced therefrom a predetermined test distance at a predetermined test angle relative to said direction of maximum power density propagation, each of said antennae spaced from each adjacent antenna a spacing distance equal to or less than a beamwidth due to the highest mode of standing wave resonant energy in the oven emittable along said perimeter segment such that the narrowest beam of said microwave leakage will be sensed by at least one of said antennae; and
   measuring means for measuring the power density sensed by each of said antennae.

12. The leakage detector of claim 11 wherein said spacing distance between adjacent antennae is predetermined such that the power density of said narrowest beam as measured by one of said adjacent antennae is at least a predetermined ratio relative to the maximum power of said narrowest beam.

13. The leakage detector of claim 11 wherein said spacing distance comprises the distance between a maximum and a closest minimum of the power density of any microwave leakage beam emitted along said perimeter segment at said predetermined test distance and angle such that the sum of the power densities measured from any two adjacent of said antennae is equal to or greater than said maximum power density of said narrowest beam.

14. The leakage detector of claim 11 wherein said spacing distance is less than the shortest distance between the minima of said narrowest beam of emissions along the line of said linear array.

15. The invention of claim 11 wherein said measuring means include commutator means for sequentially sampling the power density sensed by each of said antennae.

16. The invention of claim 11 or claim 12 further including means responsive to said measuring means for determining whenever a predetermined power density level has been exceeded by any measured power density.

17. The invention of claim 12 or claim 13 including means responsive to said measuring means for determining whether a predetermined power density level has been exceeded by said maximum possible power density of said narrowest microwave leakage beam as determined from the measurements from each of said antennae.

18. A cavity rf oscillator rf leakage detector for detecting the rf leakage from a substantially linear aperture therein, the rf energy oscillating therein having a predetermined substantially monochromatic frequency, and said cavity having a predetermined structure, said leakage detector comprising:
a plurality of rf sensitive antennae, arranged in a linear array corresponding to said linear aperture and spaced therefrom a predetermined distance at a predetermined angle relative to the direction of maximum power density propagation from said aperture, each of said antennae spaced from each adjacent of said antennae a spacing distance such that the narrowest beam of rf emitting from said aperture comprised of two minimum and one maximum spatially displaced power density points will be sensed by at least of one said antenna at a power level no less than a predetermined ratio relative to the maximum power density of said beam.

19. A rf leakage detector for detecting rf leakage from one or more substantially linear apertures in a cavity rf oscillator containing a predetermined bandwidth of rf energy, said cavity having predetermined structure such that only a predetermined set of resonance modes can oscillate therein and cause beam emission therefrom, said leakage detector comprising:
one or more linear arrays of antennae, a corresponding one for each of said apertures, each array having a plurality of antennae arranged in a line corresponding to the line of the corresponding aperture, each antenna spaced a predetermined distance from said corresponding aperture at a predetermined angle relative to the direction of maximum energy propagation therefrom, each antenna further spaced from each adjacent antenna a spacing distance such that every beam of rf energy comprising at least two minimum and one maximum spatially displaced power density points radiating from said corresponding aperture must be sensed by at least one of said antennae at no less than a predetermined minimum power density level relative to that beam's maximum power density level along the line of said array.

20. The leakage detector of claim 19 wherein said spacing distance is further defined such that when the narrowest of beams comprised of at least two minimum and one maximum power density points due to a standing wave mode of resonant energy in said cavity is sensed by a given antenna at said predetermined minimum power density level, said narrowest beam must also be sensed by an adjacent of said antennae at the same predetermined minimum power density level.

21. The leakage detector of claim 19 wherein said spacing distance is further defined such that when the narrowest beam of rf energy is sensed by a given antenna at less than its maximum power density, said narrowest beam must also be sensed by an adjacent of said antennae at a power density level no less than the maximum power density of said narrowest beam at the line of said array minus the power density sensed by said given antenna.

22. The leakage detector of claim 19 or 20 or 21 wherein said apertures include waveguide structures having two open ends, one end coupled to said cavity, the other end being substantially linear in shape, and wherein each corresponding linear antenna array is arranged to correspond to said other end.

23. The leakage detector of claim 22 further including measuring means responsive to the power density sensed by each antenna of said one or more linear antenna arrays for determining the maximum power density possible at any point along each linear array.

24. The leakage detector of claim 23 further including means responsive to said measuring means for determining the maximum possible power density emitting from said cavity through any of said one or more linear apertures.

25. The invention of claim 1 or claim 11 or claim 18 or claim 19 wherein each of said antennae include crossed dipoles.

* * * * *